US008884253B2

(12) United States Patent
Rosenthal

(10) Patent No.: US 8,884,253 B2
(45) Date of Patent: Nov. 11, 2014

(54) SYSTEM FOR MAGNETIC SHIELDING

(75) Inventor: Alon Rosenthal, Delft (NL)

(73) Assignee: Mapper Lithography IP B.V., Delft (NL)

(*) Notice: Subject to any disclaimer, the term of this patent is extended or adjusted under 35 U.S.C. 154(b) by 0 days.

(21) Appl. No.: 13/397,703

(22) Filed: Feb. 16, 2012

(65) Prior Publication Data
US 2013/0043414 A1 Feb. 21, 2013

Related U.S. Application Data

(60) Provisional application No. 61/443,475, filed on Feb. 16, 2011, provisional application No. 61/561,288, filed on Nov. 18, 2011.

(51) Int. Cl.
*H01J 37/08* (2006.01)
*H01J 37/09* (2006.01)
*G03F 7/20* (2006.01)
*H01J 37/317* (2006.01)
*H01L 21/67* (2006.01)
*H01J 37/147* (2006.01)
*B82Y 40/00* (2011.01)
*B82Y 10/00* (2011.01)

(52) U.S. Cl.
CPC ... *G03F 7/70858* (2013.01); *H01J 2237/31793* (2013.01); *H01J 37/3177* (2013.01); *H01L 21/67213* (2013.01); *H01J 2237/31754* (2013.01); *H01J 2237/31774* (2013.01); *G03F 7/708* (2013.01); *H01L 21/6719* (2013.01); *H01J 37/1475* (2013.01); *H01J 2237/0264* (2013.01); *B82Y 40/00* (2013.01); *H01J 37/09* (2013.01); *H01J 37/3174* (2013.01); *B82Y 10/00* (2013.01)
USPC .............. 250/492.2; 250/492.3; 250/396 ML; 250/396 R

(58) Field of Classification Search
CPC .......... H05K 9/00; H05K 9/0077; H01J 37/09
USPC ....................................... 250/492.1; 174/353
See application file for complete search history.

(56) References Cited

U.S. PATENT DOCUMENTS 3,235,124 A * 2/1966 Kuever .......................... 220/316
4,779,707 A * 10/1988 Smith et al. .................... 187/401
(Continued)

FOREIGN PATENT DOCUMENTS

| CN | 2711750 | 7/2005 |
| WO | WO 2009099972 A2 * | 8/2009 |
| WO | WO 2010 094719 A1 | 8/2010 |

OTHER PUBLICATIONS

Broc A. Burke et al, "Asymmetric Three-Dimensional Finite Element Analysis of a Magnetically Shielded Room with Access Ports", Advances in Biomagnetism—BIOMAG2010, IFMBE proc. 28, pp. 54-57, 2010.

(Continued)

*Primary Examiner* — Jack Berman
*Assistant Examiner* — Sean Luck
(74) *Attorney, Agent, or Firm* — Hoyng Monegier LLP; David P. Owen; Minerva Rivero

(57) ABSTRACT

The invention relates to a system for magnetically shielding a charged particle lithography apparatus. The system comprises a first chamber, a second chamber and a set of two coils. The first chamber has walls comprising a magnetic shielding material, and, at least partially, encloses the charged particle lithography apparatus. The second chamber also has walls comprising a magnetic shielding material, and encloses the first chamber. The set of two coils is disposed in the second chamber on opposing sides of the first chamber. The two coils have a common axis.

29 Claims, 5 Drawing Sheets

(56) References Cited

U.S. PATENT DOCUMENTS

| | | | |
|---|---|---|---|
| 4,948,922 A * | 8/1990 | Varadan et al. | 174/353 |
| 4,963,789 A * | 10/1990 | Buhler | 315/8 |
| 4,973,849 A * | 11/1990 | Nakamura et al. | 250/492.2 |
| 5,032,792 A | 7/1991 | Wing et al. | |
| 5,039,911 A * | 8/1991 | Buhler | 315/8 |
| 5,073,744 A * | 12/1991 | Buhler | 315/8 |
| 5,225,999 A * | 7/1993 | Luzzi | 702/85 |
| 5,355,650 A * | 10/1994 | Agar | 52/716.1 |
| 5,367,221 A * | 11/1994 | Santy et al. | 315/8 |
| 5,473,221 A * | 12/1995 | Do et al. | 315/8 |
| 5,639,150 A * | 6/1997 | Anderson et al. | 312/265.3 |
| 5,749,178 A * | 5/1998 | Garmong | 52/79.1 |
| 5,938,302 A * | 8/1999 | Anderson et al. | 312/223.1 |
| 6,115,885 A | 9/2000 | Strickler et al. | 16/266 |
| 6,269,008 B1 * | 7/2001 | Hsu | 361/816 |
| 6,362,871 B1 * | 3/2002 | Bleeker | 355/69 |
| 6,415,558 B1 * | 7/2002 | Cherry | 52/79.1 |
| 6,897,458 B2 | 5/2005 | Wieland et al. | |
| 6,958,804 B2 | 10/2005 | Wieland et al. | |
| 7,084,414 B2 | 8/2006 | Wieland et al. | |
| 7,129,502 B2 | 10/2006 | Kruit | |
| 7,525,314 B1 | 4/2009 | Heiland | |
| 2001/0025932 A1 | 10/2001 | Nakasuji | |
| 2002/0038852 A1 | 4/2002 | Suzuki | |
| 2002/0056813 A1 | 5/2002 | Hartley et al. | |
| 2002/0121615 A1 * | 9/2002 | Nakasuji | 250/492.22 |
| 2002/0153495 A1 | 10/2002 | Kageyama | |
| 2004/0055652 A1 | 3/2004 | Erickson | |
| 2005/0145662 A1 * | 7/2005 | Williams et al. | 224/519 |
| 2005/0206377 A1 * | 9/2005 | Romalis et al. | 324/301 |
| 2007/0010702 A1 * | 1/2007 | Wang et al. | 600/8 |
| 2007/0094963 A1 * | 5/2007 | McDonald et al. | 52/270 |
| 2008/0062608 A1 | 3/2008 | Fuse et al. | |
| 2009/0032722 A1 | 2/2009 | Ito et al. | |
| 2009/0122508 A1 * | 5/2009 | Uchaykin et al. | 361/818 |
| 2009/0265972 A1 * | 10/2009 | Chang | 40/771 |
| 2011/0009274 A1 * | 1/2011 | Uchaykin et al. | 505/150 |

OTHER PUBLICATIONS

T. J. Sumner et al, "Convectional magnetic shielding", J. Appl. Phys. Vol. 20 (Feb. 16, 1987), IOP Science, pp. 1095-1101, Blackett Laboratory, Imperial College of Science and Tech. Feb. 16, 1987.

Silvia Knappe-Grueneberg et al, "Influence of demagnetization coil configuration on residual field in an extremely magnetically shielded room: Model and measurements", J. Appl Physics 103, Mar. 11, 2008.

Qingmeng Wang et al, "A High Performance Static Magnetic Shielded Room for Detecting Biomagnetic Nanoparticles", 2010 Asia-Pacific International Symposium on Electromagnetic Compatibility, Apr. 12-16, 2010, China.

Vaino O. Kelha et al, "Design, Construction, and Performance of a Large-Volume Magnetic Shield", pp. 260-270, Transactions on Magnetics, Vol. Mag-18, Jan. 1, 1982.

J. Bork et al, "The 8-layered magnetically shielded room of the PTB: design and construction", Vacuumschmelze GmbH & Co. KG, Hanau, Germany.

Ramesh Adhikari, "Magnetic Shielding for Neutron EDM Experiment", pp. 1-20, Department of Physics, Berea College, Department of Physics, University of Kentucky, Jul. 27, 2009.

\* cited by examiner

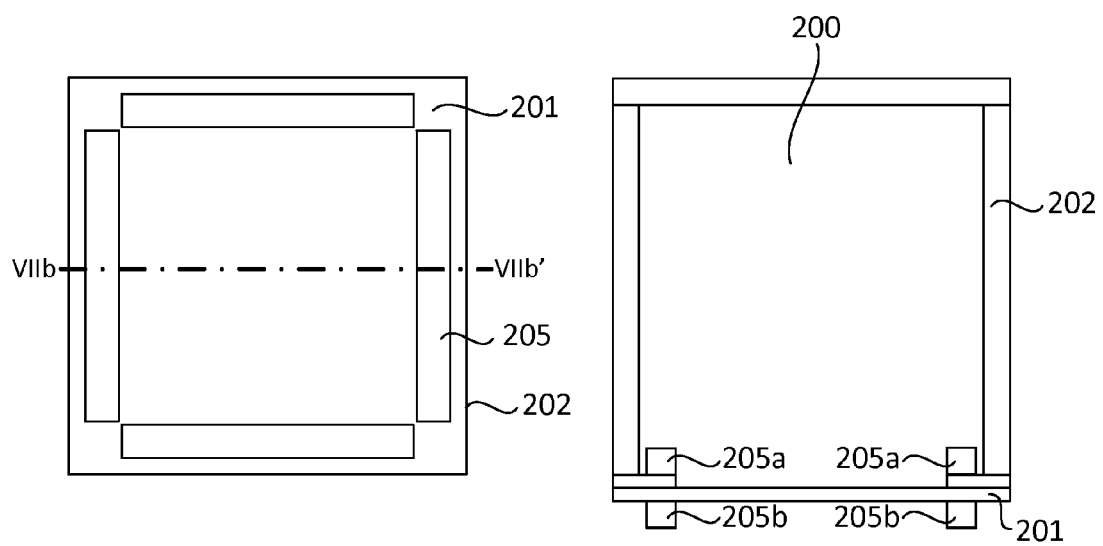
FIG. 7a  FIG. 7b
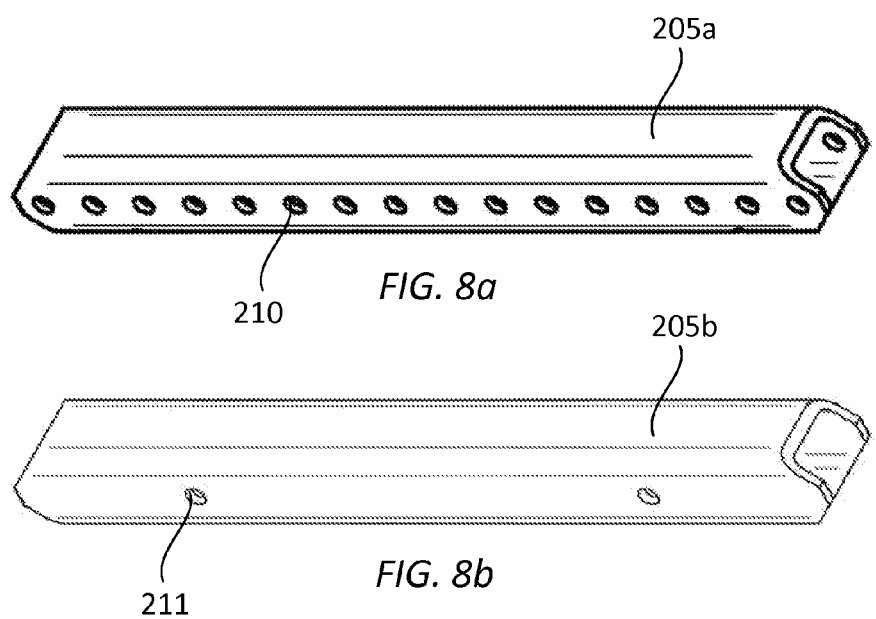
FIG. 8a
FIG. 8b

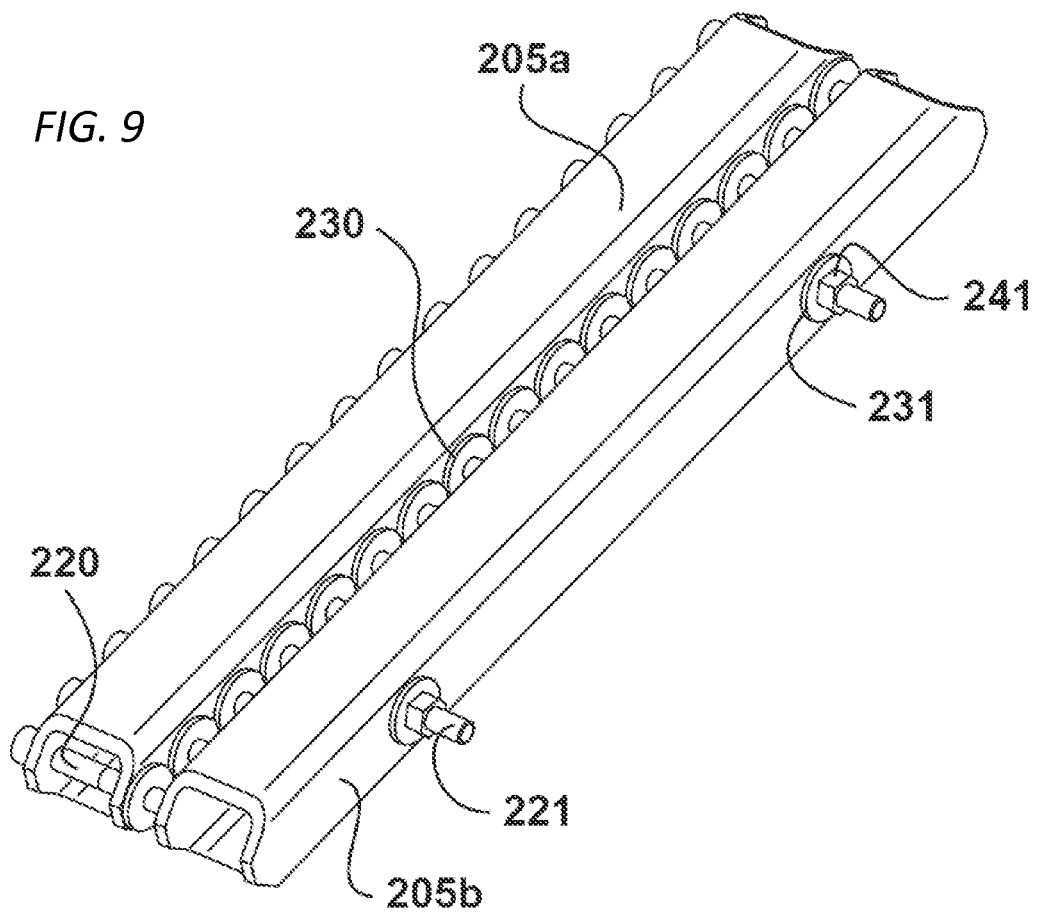

SYSTEM FOR MAGNETIC SHIELDING

BACKGROUND OF THE INVENTION

1. Field of the Invention

The invention relates to a system for magnetically shielding a charged particle lithography apparatus.

2. Description of the Related Art

In the semiconductor industry, an ever increasing desire exists to manufacture smaller structures with high accuracy and reliability. Charged particle lithography is a promising technology to meet the high demands. In this type of lithography charged particles are manipulated to transfer a onto a target surface of a substrate, typically a wafer. Because the manipulation of charged particles is performed using controlled electromagnetic manipulation, the accuracy of charged particle lithography may decrease if the lithography system is exposed to external electromagnetic fields.

For this reason a various magnetic shielding techniques have been developed for protecting charged particle lithography systems from external magnetic fields. For example, the charged particle lithography system may be enclosed in one or more layers of a material that has a high magnetic permeability. However, such shielding may be insufficient to sufficiently reduce the external fields. Furthermore, the shielding is incapable to compensate for fluctuating magnetic fields.

Another example to protect charged particle systems from external magnetic fields is the use of one or more pairs of coils capable of generating fields in a predetermined direction such that external magnetic fields can be cancelled out by the fields generated by the coils. The use of one or more coil pairs may operate perfectly well for controlling the magnetic field to which a single charged particle system is exposed. However, in the semiconductor industry of the future it is foreseeable that multiple charged particle lithography systems will operate in proximity of each other. As a result, generating a compensation field may solve the negative influence of an external field for one charged particle lithography system, while the generated compensation field acts as a disturbing external field for an adjacent charged particle system.

BRIEF SUMMARY OF THE INVENTION

The present invention provides a system for magnetically shielding a charged particle lithography apparatus with an improved performance. For this purpose, the system comprises a first chamber having walls comprising a magnetic shielding material, the first chamber enclosing, at least partially, the charged particle lithography apparatus; a second chamber having walls comprising a magnetic shielding material, the second chamber enclosing the first chamber; and a set of two coils disposed in the second chamber on opposing sides of the first chamber, the two coils having a common axis. The use of the two coils in the second chamber enables compensation of the magnetic field within the first chamber while the influence of the compensation magnetic field outside the system is kept to a minimum due to the shielding performance of the second chamber. Preferably, the system includes 3 sets of coils so as to form an orthogonal set of coil sets. In such case, the second chamber would thus enclose a first set of two coils disposed on opposing sides of the first chamber, the two coils of the first set having a common axis in a first direction; a second set of coils disposed on opposing sides of the first chamber, the two coils of the second set having a common axis in a second direction substantially perpendicular to the first direction; a third set of coils disposed on opposing sides of the first chamber, the two coils of the third set having a common axis in a third direction substantially perpendicular to the first direction and the second direction. Such orthogonal arrangement of coil sets enables magnetic field correction in all directions.

In some embodiments, the distance between a coil and the closest wall of the second chamber measured along a direction substantially parallel to the common axis is smaller than such distance between said coil and the closest wall of the first chamber. If the coils are somewhat distant from the first chamber the compensation field is more homogeneous in a direction substantially parallel to the common axis of the respective set of coils. If the distance between the coil and the closest wall of the first chamber is at least twice the distance between the coil and the closest wall of the second chamber the magnetic shielding capacity of the chambers with respect to external magnetic fields increases considerably. An optimal homogeneity is obtained in a system wherein the coils are disposed in close proximity of the walls of the second chamber.

In some embodiments, the walls of the first chamber are disposed closer to the charged particle lithography apparatus than to at least one wall of the second chamber. Such distance between the two shielding walls improves the combined magnetic shielding capacity in a direction of the at least one wall. Optimal results with respect to the combined magnetic shielding capacity of the system in all directions for external magnetic fields may be obtained in case the walls of the first chamber are disposed closer to the charged particle lithography apparatus than to any wall of the second chamber.

In some embodiments, the magnetic shielding material includes a material with a relative magnetic permeability greater than about 300,000. A suitable material is a mu metal.

In some embodiments, the first chamber is provided with a degaussing arrangement. The degaussing arrangement enables removal of a remnant field within the first chamber. Additionally, or alternatively, the second chamber may be provided with a degaussing arrangement. The degaussing arrangement in the second chamber may be used to remove a remnant magnetic field residing therein. The degaussing arrangement may comprise one or more degauss coils. Such coils are relatively easy to implement as they do not occupy a lot of space and limited adaptations of the system are needed to enable their application.

In some embodiments the system further comprises at least one magnetic field sensor for measuring the magnetic field within the first chamber. The use of a sensor may enable monitoring of the performance of the one or more sets of coils (and/or the degaussing arrangements) in the system. The system may further include a control system for controlling the currents through the coils based on information provided by the at least one magnetic field sensor. Consequently, slight variations in the external magnetic field may be compensated for. Such variations may be caused by a moveable device, such as a short stroke stage, in the lithography apparatus. Such moveable device generally has a shielding of its own that moves and pulls along the field around it which results in magnetic field variations.

The charged particle lithography system may comprise a charged particle source for generating one or more charged particle beams; a moveable device for supporting the target; and a patterning device for enabling the transfer of the one or more beams onto the target surface in accordance with the pattern. In some embodiments, the first chamber encloses the charged particle source and the patterning device, and the first chamber is provided with an opening at a side facing the moveable device, the moveable device being outside the first chamber.

In some embodiments, at least one of the first chamber and the second chamber is provided with a removably attachable door, wherein the door is attachable by means of one or more connection bars. The use of a removably attachable door enables a user to easily open the respective chamber. Preferably, the one or more connection bars are hollow. Hollow bars have a reduced weight. The one or more connection bars may include at least one inner bar for attachment to the door at the inside of the respective chamber and at least one outer bar for attachment to the door at the outside of the respective chamber, wherein the at least one inner bar and the at least one outer bar are provided with a plurality of mutually aligned holes at opposing sides thereof, the number of mutually aligned holes in the inner bar being greater than the number of mutually aligned holes in the outer bar, and wherein the at least one inner bar and the at least one outer bar are connected to each other by connection of the at least one outer bar to the at least one inner bar using a connection element extending though two mutually aligned holes in the outer bar and through corresponding mutually aligned holes in the inner bar. Such arrangement enables a relatively quick attaching and de-attaching of the door, in combination with a pressure distribution over a large area. The connection element may be a bolt, and the connection may be fixated using a nut. One or more spring elements may be provided between the connection element and the door.

BRIEF DESCRIPTION OF THE DRAWINGS

Various aspects of the invention will be further explained with reference to embodiments shown in the drawings wherein:

FIGS. 7a, 7b schematically show a front view and a top view respectively of a shielded vacuum chamber comprising a door;

FIGS. 8a, 8b show embodiments of bars for connecting a side wall and a door of the shielded vacuum chamber of FIGS. 7a, 7b; and FIG. 9 shows a way of connecting the bars of FIGS. 8a, 8b with each other.

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
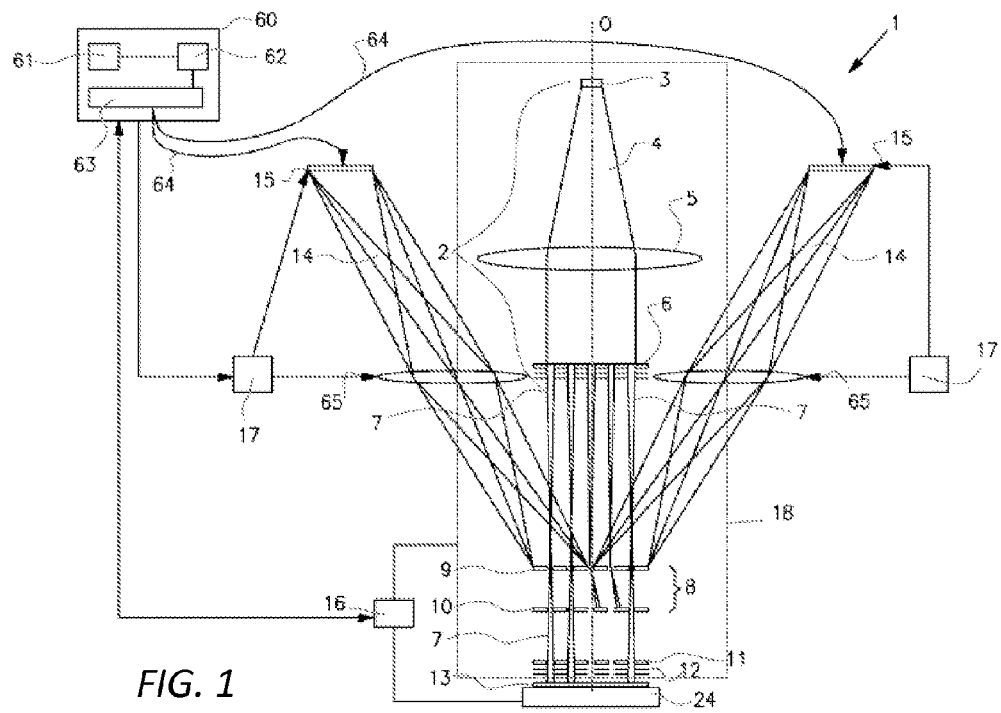
FIG. 1 schematically shows a maskless lithography system that may be used in embodiments of the invention.

FIG. 1 shows a simplified schematic drawing of an embodiment of a charged particle multi-beamlet lithography system 1. Such lithography system is for example described in U.S. Pat. Nos. 6,897,458 and 6,958,804 and 7,084,414 and 7,129,502, which are assigned to the applicant of the present application and which are hereby incorporated by reference in their entirety.

Such lithography system 1 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1, the electron beam 4 from the electron source 3 passes a collimator lens 5 for collimating the electron beam 4. The collimator lens 5 may be any type of collimating optical system. Before collimation, the electron beam 4 may pass a double octopole (not shown).

Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 14 holding pattern data may be transmitted to a projector 65 which projects light from the ends of fibers within a fiber array (schematically depicted as plate 15) into the electron optical portion of the lithography system 1, schematically denoted by the dashed box and reference number 18.

In the embodiment of FIG. 1, the modulated light beams are projected on to the beamlet blanker array 9. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. Suitably, in order to project the light beams 14 onto corresponding light sensitive elements optical elements such as a projector 65 may be used. Additionally, to allow projection of the light beams 14 at a suitable incident angle, a mirror may be included, for example suitably placed between a projector 65 and the beamlet blanker array 9.

The projector 65 may be appropriately aligned with the plate 15 by a projector positioning device 17 under control of the control unit 60. As a result, the distance between the projector 65 and the light sensitive elements within the beamlet blanker array 9 may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 15 and a projector 65 located away from the space that may be occupied by the charged particle beamlets has the advantage that the beamlet disturbance is minimized, and the construction of the beamlet blanker array 9 is less complex.

The modulated beamlets coming out of the beamlet modulator are projected as a spot onto a target surface 13 of a target 24 by the beamlet projector. The beamlet projector typically comprises a scanning deflector for scanning the modulated beamlets over the target surface 13 and a projection lens system for focusing the modulated beamlets onto the target surface 13. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface 13 positioned at a target plane. For lithography applications, the target usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

In some embodiments, a beam protector (not shown) may be located between the target surface 13 and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface 13 is correct, while the deflector array 11 may ensure by appropriate scanning operations that the position of a pixel on the target surface 13 is correct on a microscale. Particularly, the operation of the deflector array 11 is such that a pixel fits into a grid of pixels which ultimately constitutes the pattern on the target surface 13. It will be understood that the macroscale positioning of the pixel on the target surface 13 is suitably enabled by a wafer positioning system present below the target 24.

Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figures 2A, 2B:
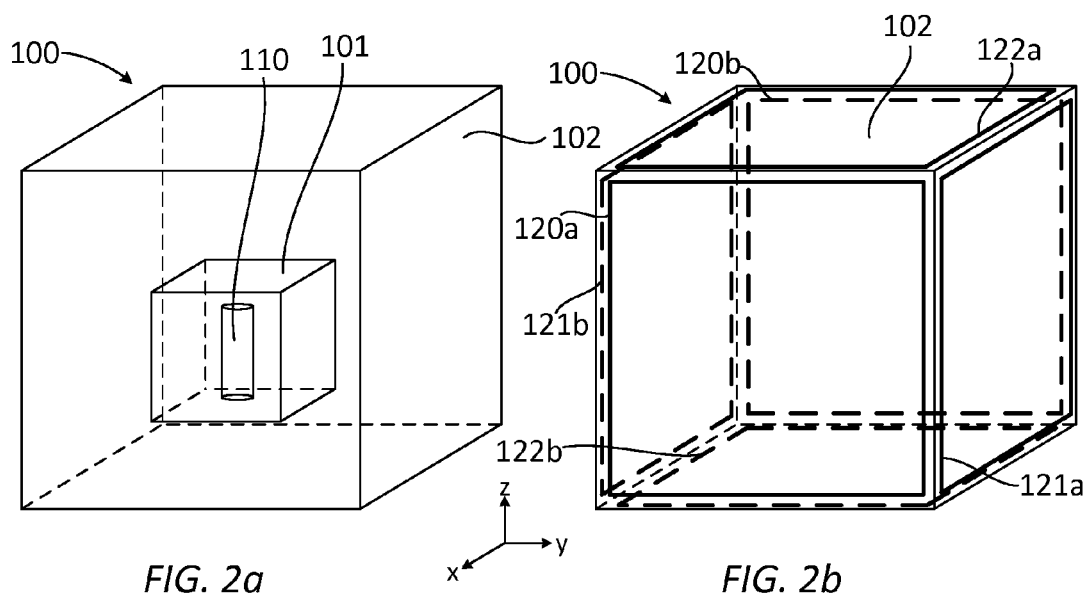
FIGS. 2a, 2b schematically show a system for magnetically shielding a charged particle lithography apparatus according to an embodiment of the invention.

FIGS. 2a, 2b schematically show a system 100 for magnetically shielding a charged particle lithography apparatus according to an embodiment of the invention. FIG. 2a, 2b each show different features within the system 100 for clarity. The system 100 comprises a first chamber 101 enclosing the charged particle lithography apparatus, represented by a cylinder 110. The system 100 further includes a second chamber 102 enclosing the first chamber 101. The first chamber 101 and the second chamber 102 are vacuum chambers or portions thereof. The first chamber 101 and the second chamber 102 have walls comprising a magnetic shielding material, i.e. a material with a high magnetic permeability, i.e. a magnetic permeability greater than about 20,000. Preferably, the magnetic shielding material has a magnetic permeability greater than about 300,000. Preferably, the magnetic shielding material also has a low remanence. Examples of magnetic shielding materials include, but are not limited to, a type of mu-metal and Nanovate™-EM.

As schematically shown in FIG. 2b, the system 100 further comprises a set of coils 120a, 120b disposed in the second chamber 102 on opposing sides of the first chamber 101. The two coils 120a, 120b have a common axis. The two coils 120a, 120b can be used to produce a magnetic field. In order to enable compensation in 3 dimensions, the system 100 preferably comprises three sets of two coils. Besides a first set of two coils 120a, 120b having a common axis in a first direction, e.g. the x-direction, the system 100 further comprises a second set of two coils 121a, 121b, and a third set of two coils 122a, 122b. The two coils of the second and third sets each have a common axis, and are placed on opposing sides of the first chamber 101 within the second chamber 102. The common axis of the second set of two coils 121a, 121b is oriented in a second direction substantially perpendicular to the first direction, e.g. the y-direction. The common axis of the third set of coils 122a, 122b is directed in a third direction, e.g. the z-direction, being substantially perpendicular to the first direction and the second direction.

The magnetic field that can be produced using the coils becomes more uniform in the region at which the charged particle lithographic apparatus 110 is located when the coils of a set of coils 120, 121, 122 are spaced apart further. For this reason, the distance between a coil and the closest wall of the second chamber 102 measured along a direction substantially parallel to the respective common axis is preferably smaller than such distance between the same coil and the closest wall of the first chamber 101. Preferably, the distance between a coil of a set of coils and the closest wall of the first chamber 101 is at least twice the distance between that coil and the closest wall of the second chamber 102. Most preferably, the coils are disposed in close proximity of the walls of the second chamber 102. Additionally, a more uniform magnetic field may be created in case each coil of a set of coils encloses a larger area.

One or more of the coil pairs 120, 121, 122 may be so-called Helmholtz coil pairs. The coils in a Helmholtz coil pair are substantially identical circular magnetic coils that are placed symmetrically along a common axis, and separated by a distance equal to the radius of the coils. Setting the coil separation distance equal to the coil radius minimizes the non-uniformity of the magnetic field that is generated at the center of the coils.

The use of one or more sets of compensation coils within a shielded environment, i.e. the second chamber 102, enables a compact and flexible design of shielding. Furthermore, the encapsulation of the coils by the second chamber 102 results in reduction of the strength of the compensation fields outside the second chamber 102. In other words, most, if not all of the fields generated within the second chamber 102 by one or more sets of coils stay within the second chamber 102. Consequently, if multiple lithography systems are operated in proximity of each other, the compensation fields generated to optimize the performance of one charged particle lithography apparatus 110 does not, or merely to a very limited extent, negatively effect the performance of a neighboring lithography apparatus 110.

It has been found that using a small shielding chamber 101 inside the second chamber 102 improves the shielding considerably. In particular in case the walls of the first chamber 101 are disposed closer to the charged particle lithography apparatus than to any wall of the second chamber 102, the magnitude of the shielding effect of the two chambers effectively corresponds to a multiplication of the shielding effect magnitudes of the first chamber 101 and the second chamber 102 separately. If the walls of the first chamber 101 are close to the walls of the second chamber 102, for example as used in a two-layered shielding chamber, the shielding effect magnitude of the assembly merely corresponds to a sum of the separate shielding effect magnitudes.

Operation of the one or more sets of two coils 120, 121, 122 can be based on several inputs. In some applications, compensation is merely applied for a stable external magnetic field such as the average earth magnetic field. In some other cases, activation of one or more coil pairs is based on measurements performed with a sensor arrangement. Placing the sensor arrangement outside the shielded environment is relatively easy to implement, but the measurement may lack accuracy. The shielding of a chamber may not shield the external magnetic field in an entirely homogeneous way. As a result, activation of the coils based on external measurements may not lead to satisfactory compensation of the external magnetic fields as experienced at the position of the lithographic apparatus.

In view of the desirable accuracy in lithography applications, at present and even more demanding in the near future, such lack of accuracy is undesirable.

Figure 3:
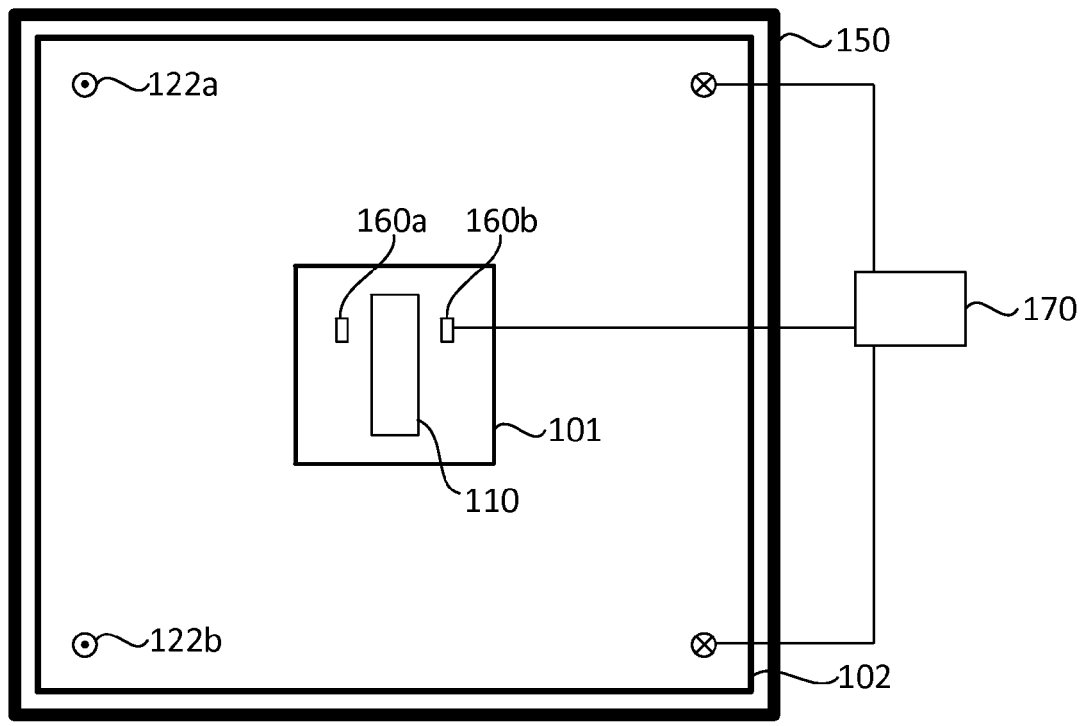
FIG. 3 is a cross-sectional view of an embodiment of a system for magnetically shielding a charged particle lithography apparatus comprising a sensor arrangement.

FIG. 3 is a cross-sectional view of an embodiment of a system for magnetically shielding a charged particle lithography apparatus comprising a sensor arrangement. The system includes the two shielding chambers 101, 102 having walls comprising a magnetic shielding material. A charged particle lithographic apparatus 110 is provided within the first chamber 101. The system further includes a set of coils 122a, 122b. The cross-sections of the coil denote a possible way of current direction. The cross-sections provided with a cross represents a current flowing into the paper, while the cross-sections provided with a center dot represent a current flowing out of the paper. All system elements are provided within a vacuum chamber 150.

The system further comprises a sensor arrangement comprising one or more magnetic field sensors. In the shown embodiment, the sensor arrangement comprises two magnetic field sensors 160a, 160b. The sensors 160a, 160b are arranged for measuring the magnetic field in close proximity of the location of the lithographic apparatus 110. Preferably, the sensors 160a, 160b are tri-axial magnetic field sensors, i.e. the sensors can measure the magnetic field in three dimensions simultaneously. Based on the measurements performed by the sensors 160a, 160b, a control unit 170 may control the current in the one or more coil pairs 120, 121, 122 for compensation.

An example of a magnetic field sensor that may be used in embodiments of the invention is a the triaxial magnetic field sensor FL3-100 manufactured by Stefan Mayer Instruments located in Dinslaken, Germany.

Figure 4:
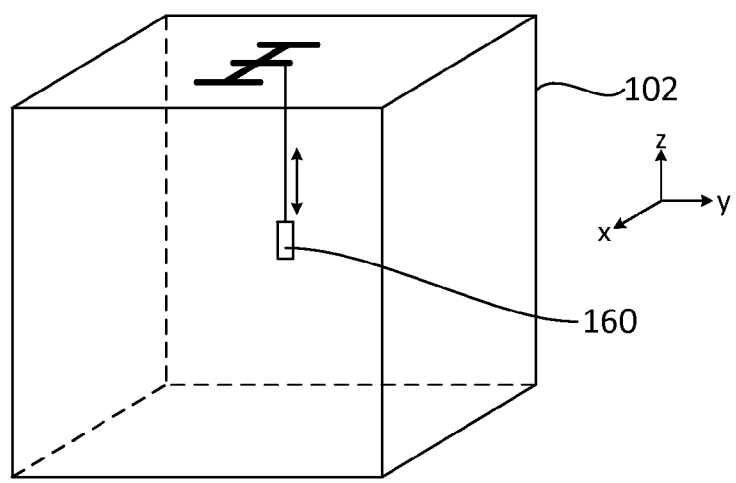
FIG. 4 schematically shows an embodiment of a sensor positioning arrangement.

The position of a magnetic sensor within the system may be adjustable. FIG. 4 schematically shows an embodiment of a sensor positioning arrangement, that enables adjustment of the position of a magnetic sensor 160. In particular, after maintenance operations, adjustment of the position of the one or more sensors 160 enables the optimization of the measurement, and therefore, improved compensation of a disturbing magnetic field. Note that in FIG. 4 the shielding chamber 101 is not shown to improve clarity.

The magnetic field sensors 160a, 160b may be placed inside the shielding chamber 101 as schematically depicted in FIG. 3. However, in some applications it may be sufficient to place the sensor arrangement, or at least one magnetic field sensor thereof, outside the shielding chamber 101, but inside chamber 102.

Figure 5:
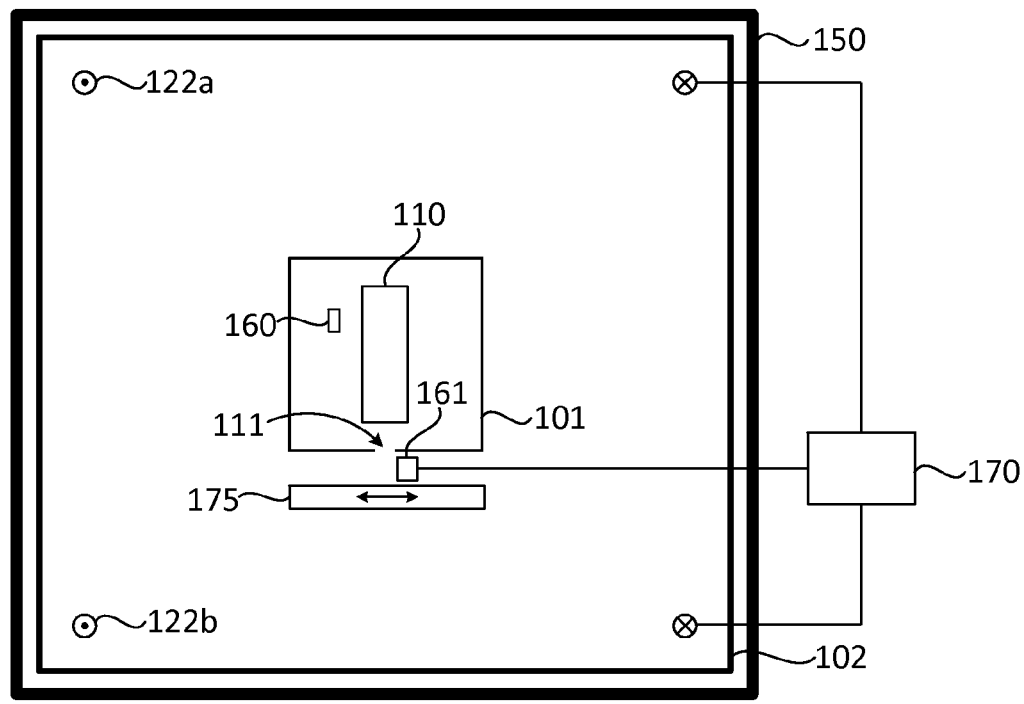
FIG. 5 is a cross-sectional view of another embodiment of a system for magnetically shielding a charged particle lithography apparatus comprising a sensor arrangement FIG. 6a schematically shows an embodiment of a degauss coil for use in combination with a cubical shielding chamber.

FIG. 5 is a cross-sectional view of another embodiment of a system for magnetically shielding a charged particle lithography apparatus comprising a sensor arrangement. In this arrangement, the sensor arrangement comprises a magnetic field sensor 161 outside the chamber 101. The sensor 161 is preferably placed between a stage element 175 and an opening 111 in the chamber 101 to enable transfer of a radiation beam or beamlets originating from the lithography apparatus 110. The magnetic field sensor 161 is preferably positioned in close proximity of the opening 111. This position allows the magnetic field sensor 161 to have an adequate indication of the field experienced by the radiation being projected through the opening 161 during use of the lithography system 110 in the chamber 101. The stage element 175 is arranged for supporting the substrate support structure and a substrate to be placed thereon, for example target 24 with surface 13 in FIG. 1. The stage element 175 may induce variations of the magnetic fields within the chamber 102. The stage element 175 may take the form of a so-called short-stroke stage.

An exemplary way of using the sensor 161 in a method of compensating the magnetic field within a chamber comprising a lithography apparatus comprises placing the substrate support structure at a central position below the opening 162, and measuring the magnetic field with the magnetic field sensor 161.

The magnetic field may then be compensated by means of the coils, such as coils 122a, 122b within the chamber 102 until the magnetic field measured by the sensor 161 substantially equals zero in all directions. In particular, in case a sensor is used measuring in three orthogonal directions, the desired magnetic (B-)field (Bx,By,Bz) measured by the sensor while compensation takes place equals (0,0,0) using the set of coils 122a, 122b having a common axis in one direction, and similar sets of coils having a common axis substantially perpendicular to the common axis of coils 122a, 122b.

The compensation currents running through the coils may then be maintained during subsequent movement of the stage element 175 during exposure of the substrate placed on the substrate support structure. Although this method of compensating will be sufficient in many applications, sometimes further compensation during movement of the stage element 175 may be needed.

The system shown in FIGS. 2a, 2b effectively shields the charged particle lithography apparatus inside. However, the lithography apparatus will still be exposed to external magnetic fields in case the chambers 101, 102 are opened, for example to exchange substrate to be processed such as wafers. A brief exposure to external magnetic fields will have the effect that a small remnant magnetic field is introduced into the walls of the chambers 101, 102. The remnant field in the walls of the second chamber 102 will not have a profound effect on the performance of the lithography apparatus, because the field is generally weak in nature, and the distance is relatively large. However, the remnant field in the first chamber walls may have a negative influence on the performance of the lithography apparatus.

Figures 6A, 6B:
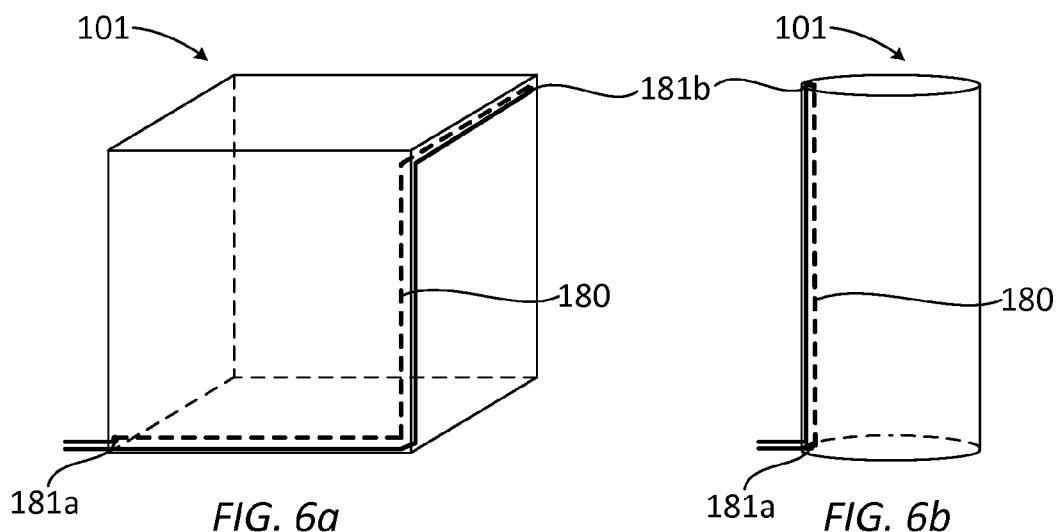
FIG. 6b schematically shows an embodiment of a degauss coil for use in combination with a cylindrical shielding chamber.

Therefore, the first chamber 101 may be provided with a degaussing arrangement. FIG. 6a schematically shows an embodiment of a degauss coil 180 for use in combination with a cubical shielding chamber 101, whereas FIG. 6b shows an embodiment of a degauss coil 180 for use in combination with a cylindrical shielding chamber 101. The degaussing arrangement enables removal of a remnant field within the shielding chamber 101.

The degauss coil 180 follows a path entering the chamber 101 through a hole 181a, then following along three edges on the inside of the chamber walls, exiting the chamber 101 through a hole 181b, and finally returning along a similar route along the chamber walls at the outside of the chamber 101. In FIGS. 6a, 6b, the shown degaussing arrangement merely shows one degauss coil 180 for clarity. In practice, the shielding chambers 101 may be provided with more than one degauss coil 180 to allow for the removal of the remnant field in all walls of the first chamber 101. For example, good results have been obtained with four degauss coils 180 for a cubical shielding chamber 101.

FIG. 7a schematically shows a front view of a shielded vacuum chamber 200 comprising a door 201. FIG. 7b schematically shows a top view of the chamber 200 in FIG. 7a along the line VIIb-VIIb'. The door 201 is removably attachable to a side wall 202 of the vacuum chamber 200, for example by using one or more connection bars 205. The connection bars 205 may include inner bars 205a and outer bars 205b. The use of such connection bars 205a, 205b provides a door closing mechanism that provides and maintains magnetic continuity. Furthermore, the bars 205a, 205b are easily applicable.

Preferably, the bars 205a, 205b are hollow, and form thimbles or buses. The use of hollow bars reduces the weight of the system, and may increase the structural integrity of the system. The bars 205a, 205b are made of a non-magnetic material, such as aluminum.

FIGS. 8a, 8b show embodiments of bars 205a, 205b respectively. The bars 205a, 205b are hollow. The bar 205a is provided with a plurality of holes 210 at opposing sides. The holes 210 are aligned with respect to each other such that a hole 210 at one side surface corresponds to a hole 210 at the opposing side surface of the bar 205a. Similarly, the bar 205b is provided with a plurality of mutually aligned holes 211 at opposing sides. The number of holes 210 in bar 205a is greater than the number of holes 211 in bar 205b.

The hollow bar 205a is to be connected to the side wall 202 at the inside of the door 201. The connection between the side wall 202 and the bar 205a may be established by using bolts 220 directed through the holes 210 and tightened using nuts 230. FIG. 9 shows such arrangement without the presence of the side wall 202. The large number of connection points enables a connection that is able to distribute pressure quickly over a large area.

The bar 205b is to be connected to the door 201 at the outside. The connection between the bar 205b and the door 201 is established by connecting the bar 205b to the bar 205a using a large bolt 221 that extends through two mutually aligned holes 211 in the bar 205b and through corresponding mutually aligned holes 210 in the bar 205a. The connection may be fixated using a suitable nut 231. Since the bar 205b has a limited number of holes, only a few connection elements need to be removed or place to enable the opening or closing of the door 201 respectively. The connection with the bar 205a enables a distribution of the pressure over a large area of the door so that a good magnetic closure is achieved. One or more spring elements may be provided between bars 205a and 205b and door 201 and side wall 202. By providing spring elements the pressure can be more evenly distributed which further improves magnetic closure.

It will be understood that the door 201 and the side wall 202 to be connected to the bars 205a, 205b need to be provided with suitable openings to facilitate a connection as described above and demonstrated in FIG. 9 (without the presence of side wall 202 and door 201 for clarity).

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A system for magnetically shielding a charged particle lithography apparatus, the system comprising:
a first chamber having walls comprising a magnetic shielding material, the first chamber enclosing, at least partially, the charged particle lithography apparatus;
a second chamber forming part of a vacuum chamber and having walls comprising a magnetic shielding material, the second chamber enclosing the first chamber;
a moveable stage element arranged for supporting a substrate support structure, and positioned outside the first chamber and inside the second chamber;
a set of two coils disposed in the second chamber outside of the first chamber and on opposing sides of the first chamber and the moveable stage element, the two coils having a common axis, and
at least one magnetic field sensor positioned outside the first chamber and inside the second chamber, for measuring the magnetic field within the second chamber,
wherein the first chamber is provided with an opening at a side facing the moveable stage element, for allowing charged particle radiation originating from the lithography apparatus to be exposed on a substrate provided on the substrate support structure, and wherein the at least one magnetic field sensor is positioned between the opening and the moveable stage element,
wherein the system comprises a control system configured for controlling the currents through the coils based on information provided by the at least one magnetic field sensor, so as to nullify the magnetic field measured between the opening and the moveable stage element during operation,
wherein the distance between a coil and the closest wall of the second chamber measured along a direction substantially parallel to the common axis is smaller than such distance between said coil and the closest wall of the first chamber.

2. The system of claim 1, wherein the second chamber encloses:
a first set of two coils disposed on opposing sides of the first chamber, the two coils of the first set having a common axis in a first direction;
a second set of coils disposed on opposing sides of the first chamber, the two coils of the second set having a common axis in a second direction substantially perpendicular to the first direction;
a third set of coils disposed on opposing sides of the first chamber, the two coils of the third set having a common axis in a third direction substantially perpendicular to the first direction and the second direction.

3. The system of claim 1, wherein the distance between the coil and the closest wall of the first chamber is at least twice the distance between said coil and the closest wall of the second chamber.

4. The system of claim 1, wherein the coils are disposed in close proximity of the walls of the second chamber.

5. The system of claim 1, wherein all walls of the first chamber are disposed closer to the charged particle lithography apparatus than to at least one wall of the second chamber.

6. The system of claim 5, wherein all walls of the first chamber are disposed closer to the charged particle lithography apparatus than to any wall of the second chamber.

7. The system of claim 1, wherein the magnetic shielding material includes a material with a relative magnetic permeability greater than 300,000.

8. The system of claim 7, wherein the material is a mu metal.

9. The system of claim 1, wherein the first chamber is provided with a degaussing arrangement.

10. The system of claim 9, wherein the degaussing arrangement comprises one or more degauss coils.

11. The system of claim 1, wherein the second chamber is provided with a degaussing arrangement.

12. The system of claim 11, wherein the degaussing arrangement comprises one or more degauss coils.

13. The system of claim 1, wherein the first chamber has a cubical, cylindrical or box-like shape.

14. The system of claim 1, further comprising at least one magnetic field sensor for measuring the magnetic field within the first chamber.

15. The system of claim 14, further comprising a control system for controlling the currents through the coils based on information provided by the at least one magnetic field sensor.

16. The system of claim 1, wherein the charged particle lithography system comprises:
a charged particle source for generating one or more charged particle beams;
a moveable device for supporting the target; and
a patterning device for enabling the transfer of the one or more beams onto the target surface in accordance with the pattern.

17. The system of claim 16, wherein the first chamber encloses the charged particle source and the patterning device, wherein the moveable device is located outside the first chamber, and wherein the first chamber is provided with the opening at a side facing the moveable device.

18. The system of claim 1, wherein at least one of the first chamber and the second chamber is provided with a removably attachable door, wherein the door is attachable by means of one or more connection bars.

19. The system of claim 18, wherein the one or more connection bars are hollow.

20. The system of claim 18, wherein the one or more connection bars include at least one inner bar for attachment to the door at the inside of the respective chamber and at least one outer bar for attachment to the door at the outside of the respective chamber, wherein the at least one inner bar and the at least one outer bar are provided with a plurality of mutually aligned holes at opposing sides thereof, and wherein the at least one inner bar and the at least one outer bar are connected to each other by connection of the at least one outer bar to the at least one inner bar using a connection element extending though two mutually aligned holes in the outer bar and through corresponding mutually aligned holes in the inner bar.

21. The system of claim 20 wherein the number of mutually aligned holes in the inner bar is greater than the number of mutually aligned holes in the outer bar.

22. The system of claim 20, wherein the connection element is a bolt, and the connection is fixated using a nut.

23. The system of claim 18, wherein one or more spring elements are provided between the bars and the door.

24. A method for magnetically shielding in a charged particle lithography apparatus, the method comprising:
providing the charged particle lithography apparatus enclosed in a first chamber of a system for magnetically shielding the charged particle lithography apparatus according to claim 1;
providing a substrate on a substrate support structure on a moveable stage element arranged in a second chamber of the system;
exposing the substrate with charged particle radiation originating from the lithography apparatus via an opening in the first chamber, and
measuring the magnetic field within the second chamber with at least one magnetic field sensor positioned outside the first chamber and inside the second chamber, between the opening and the moveable stage element.

25. The method of claim 24, wherein the step of exposing the substrate provided on the substrate support structure comprises:
placing the substrate support structure at a position below the opening in the first chamber.

26. The method of claim 24, wherein the step of measuring the magnetic field within the second chamber comprises:
adjusting compensation currents in the coils until the magnetic field measured with the at least one magnetic field sensor substantially equals zero, and
maintaining the compensation currents in the coils during exposure of the target by the charged particle lithography apparatus.

27. The method of claim 25, wherein the step of maintaining the compensation currents in the coils during exposure of the target comprises:
measuring and compensating the magnetic field during subsequent movement of the stage element supporting the target.

28. A system for magnetically shielding a charged particle lithography apparatus, the system comprising:
a first chamber having walls comprising a magnetic shielding material, the first chamber enclosing, at least partially, the charged particle lithography apparatus;
a second chamber forming part of a vacuum chamber and having walls comprising a magnetic shielding material, the second chamber enclosing the first chamber;
a moveable stage element arranged for supporting a substrate support structure, and positioned outside the first chamber and inside the second chamber;
wherein the first chamber is provided with an opening at a side facing the moveable stage element, for allowing charged particle radiation originating from the lithography apparatus to be exposed on a substrate provided on the substrate support structure;
wherein the first chamber has a cubical or box-like shape, and wherein the first chamber is provided with a degaussing arrangement, comprising at least one degauss coil that forms a path along three consecutive edges on the inside of the first chamber walls and back along the three consecutive edges on the outside of the first chamber walls, and
wherein the distance between a degauss coil and the closest wall of the first chamber measured along a direction substantially perpendicular to the path is smaller than such distance between said degauss coil and the closest wall of the second chamber.

29. The system according to claim 28, wherein the second chamber has a cubical or box-like shape, and wherein the second chamber is provided with a further degaussing arrangement comprising at least one further degauss coil that traces a further path along three consecutive edges on the inside of the second chamber walls, and returning along the three consecutive edges on the outside of the second chamber walls,
wherein the distance between a further degauss coil and the closest wall of the second chamber measured along a direction substantially perpendicular to the further path is smaller than such distance between said further degauss coil and the closest wall of the first chamber.

* * * * *